Sept. 23, 1969 J. M. BENTLEY ET AL 3,468,729

METHOD OF MAKING A SEMICONDUCTOR BY OXIDIZING AND SIMULTANEOUS DIFFUSION OF IMPURITIES HAVING DIFFERENT RATES OF DIFFUSIVITY

Filed March 21, 1966

INVENTORS
John M. Bentley
and Melvin W. Aarons
BY
John L. Niegroff
ATTORNEY

United States Patent Office 3,468,729

Patented Sept. 23, 1969

3,468,729
METHOD OF MAKING A SEMICONDUCTOR BY OXIDIZING AND SIMULTANEOUS DIFFUSION OF IMPURITIES HAVING DIFFERENT RATES OF DIFFUSIVITY

John M. Bentley, Crofton, Md., and Melvin W. Aarons, Trumbull, Conn., assignors to Westinghouse Electric Corporation, Pittsburgh, Pa., a corporation of Pennsylvania Filed Mar. 21, 1966, Ser. No. 535,814
Int. Cl. H01l 7/44
U.S. Cl. 148—187 2 Claims

ABSTRACT OF THE DISCLOSURE

This invention relates to a method of making a semiconductor. A base semiconductor of "n" conductivity is selected and masked with an oxide coat on both sides of the semiconductor wafer. The oxide is removed from portions on opposite sides of the semiconductor. The oxide-removed surfaces do not overlap. The semiconductor is subjected to a diffusion environment wherein "p" and " n" or both simultaneously diffused into the wafer with the "p" impurity diffusing at a faster rate than the "n" impurity. The diffusion step produces a semiconductor material having four separate zones of differing conductivities in the semiconductor.

This invention relates to a novel switch system utilizing balanced units and a method of making the units. The invention is particularly directed to a system incorporating a monolithic bilateral switch unit that combines the properties of latching operation, bilateral current flow, low forward impedance when closed, high backward impedance when open, high current capacity and high speed.

The terms "switch" and "gates" are sometimes used in the literature interchangeably and this sometimes results in confusion. For example, it is common in logic circuits, power circuits and radio frequency circuits to refer to these devices as "gates." To distinguish from this in signal switching, such as in commutators, multiplexers and choppers these devices must provide exactness of information transfer. Accordingly, in all the above categories except the latter a straight line transfer relation is not a requirement. On the other hand, in the latter category where the straight line transfer characteristic is desired, the devices must have a transfer characteristic similar to that of an ohmic contact that determines the quality of the device or circuit. The present invention relates to this latter category, and in order to further define the present subject matter and separately distinguish them from all others they will be referred to as "exact switches," thus pointing out the need for accuracy, precision and exactness.

Substantial effort has been expended in the past to obtain an exact switching circuit for general application and many configurations have been provided. Even with the few configurations that have proved to be reasonably satisfactory, it is necessary to design systems around the switches to make optimum use of their characteristics. The type of exact switches which is gaining great acceptance is the so-called four layer diode which is the subject to which this present invention relates. In all of these electronic switching applications the following requirements are usually imposed: (a) The driving signal is not interacted with or affected by the signal being switched. Any other potential source required for switch operation must not affect the output. (b) More than one switch must be capable of operating at the same time. (c) The switch must not require a steady state gating signal to hold it in the "ON" or "OFF" state. (d) The switch must operate for any length of time in the "ON" or "OFF" condition without degrading the information transfer. (e) The drive source power requirements must be extremely small. All of the above requirements are met by the present invention.

As will be seen from the description of the circuit in which the four-layer diodes of the present invention are used, it will be noted that these diodes are used as control rectifiers and are connected in back-to-back relation to obtain the bilateral operation for AC signals about ground. The back-to-back arrangement also allows cancellation of potentials developed across the rectifier when conducting. Since these are latching devices, transformer inputs can be utilized without any limitation as to the "ON" time and "OFF" time.

It will be seen from the general description that the circuits in which this device is utilized are bridge circuits and that the potentials developed across the rectifiers can only be obtained when the legs of the bridge are balanced. Variation of components with temperature changes is an ever present problem and therefore it will be seen that it is desirable to have controlled rectifiers in the bridge circuit which have as near identical properties as possible.

Accordingly, an object of the present invention is to provide a novel and improved switch system utilizing monolithic bilateral latchable switch units having low ratio of forward to backward impedance, high current capacity and high speed.

Another object is to provide a novel and improved bilateral switch system utilizing four-layer pn junction diodes having substantially identical characteristics.

Another object is to provide a novel method of making the matched four-layer diodes in such circuits for obtaining high-speed latching systems.

Another object is to provide a novel monolithic latching bilateral switch made in accordance with the novel method described herein.

Other and further objects will become apparent from the following description taken in connection with the accompanying drawings, in which.

Figures 1, 2, 3, 4, 5, 6, 7, 8:
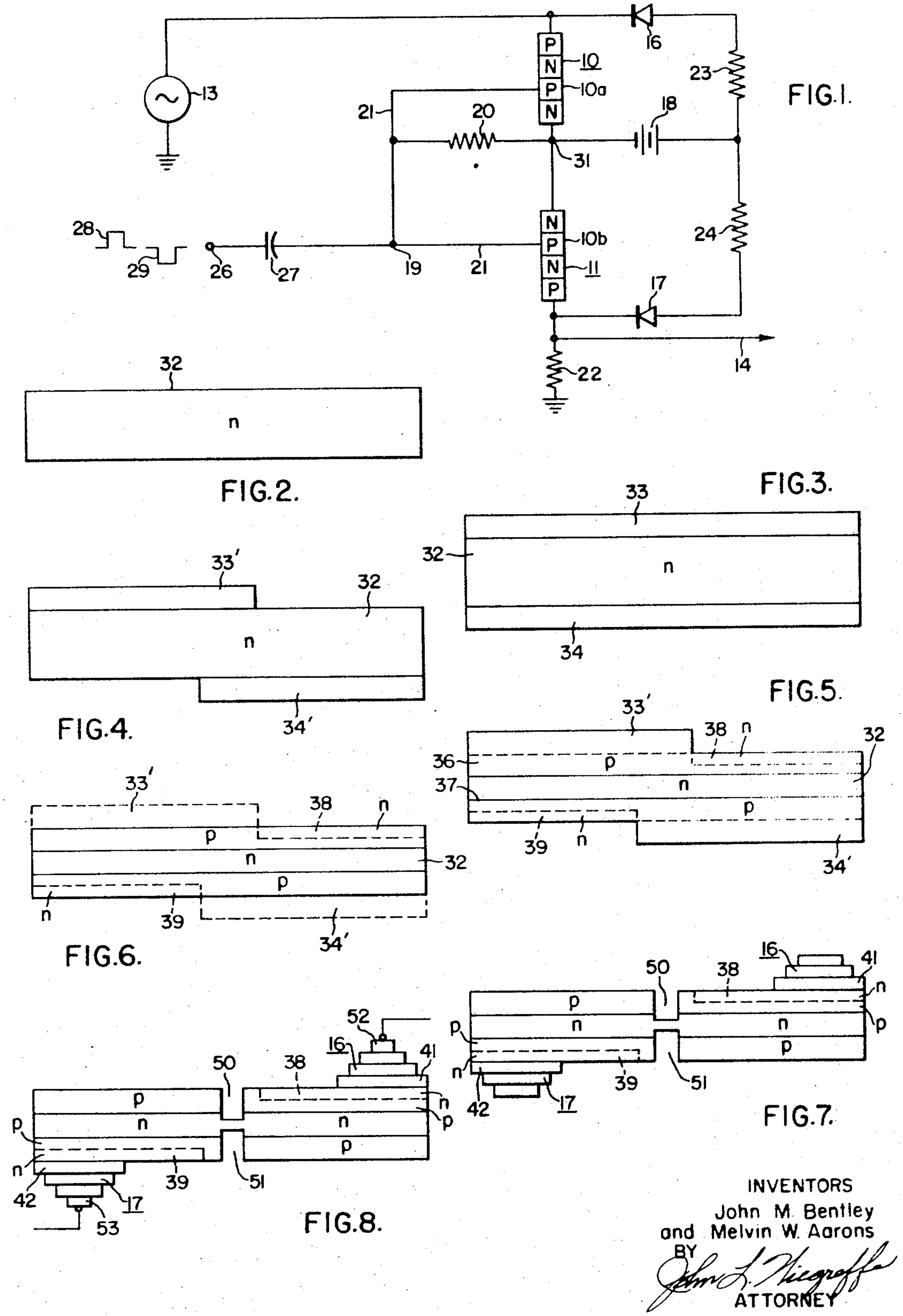
FIG. 1 is a circuit diagram in accordance with the present invention.
FIG. 2 illustrates the results of the first step of fabrication of the switching units of the present invention.

FIGS. 3 to 7, inclusive, illustrate subsequent steps of the method of fabrication of the present invention;

FIG. 8 illustrates a pair of monolithic four-layer diodes made in accordance with the present invention.

Essential units of this invention are the two novel four-layer diodes 10 and 11 which are in a circuit between signal input source 13 and the signal output 14 An analysis of this circuit will quickly show that the four-layer diodes are incorporated as controlled rectifiers in a bridge circuit serially connected between the signal input and the signal output. For purposes of simplification the description of circuit will be incorporated in the description of the operation.

For the condition of open circuit, or high impedance, no current will flow through the conventional two-layer pn junction diodes 16 or 17 nor the controlled rectifier diodes 10 and 11. Accordingly, when the high impedance is developed between the input 13 and the output 14 the positive potential supplied by the battery 18, that is used to bias both of the rectifiers 10 and 11 into their low impedance regions, is not sufficient to fire the diodes. However, a positive pulse supplied simultaneously to the p region bases 10*a* and 10*b* of the rectifiers 10 and 11, respectively, through the point 19 on the conductor 21 will cause both diodes 10 and 11 to fire, that is, conduct, and move their respective operating points into their low impedance regions. The positive bias potential of the battery 18 does not cause any potential difference across the load resistor 22 so long as the diodes 10 and 11 are of similar characteristics, or are balanced by respective resistors 23 and 24. A close look at the circuit will indicate clearly that the resistors 23 and 24 are in a series circuit with the diodes 16 and 17, which circuit is in parallel with the two diodes 10 and 11 that are connected in series between the input and the output. Another way of looking at the circuit is that the resistors 23 and 24 are in the legs of the bridge circuit, opposite arms of which include the diodes 10 and 11. It is accordingly for this reason that the biasing battery 18 does not apply a potential difference across the load resistor 22 when the bridge is balanced. The impedance seen by the input source 13 between the gating input pulse point 19 and the output 14 is only the dynamic impedance of the diodes 10 and 11 at their operating point which is quite low, i.e., a fraction of an ohm.

Now assume that a gate input signal is applied through the gating signal input terminal 26, the isolating capacitor 27 to the point 19 and through the conductor 21 to the bases of the diodes 10 and 11. If this is a positive gating pulse as indicated at 28, it will cause the diodes 10 and 11 to conduct heavily and will move the diodes 10 and 11 into their lower impedance regions and they will remain there until the negative pulse signal at 29 is applied to the terminal 26 to drive the diodes 10 and 11 back to their open circuit, or high impedance region. The capacitor 27 isolates the gating signal source from the ground potential but, if desired, the input gating signal could be supplied through a suitable transformer, the output of which is connected across the resistor 20 in connection 31.

An important aspect of the present invention is the novel method of making the four-layer controlled rectifier diodes 10 and 11 wherein the layers of the two diodes are made simultaneously during the different diffusion steps, thus insuring the sameness of characteristics in both of the diodes.

Referring now to FIG. 2, four-layer diodes may be fabricated into a monolithic structure first starting with a five mil wafer 32 of n-type silicon. As an example, the n-type silicon may be a wafer having a resistance of approximately fifty ohms per centimeter.

Next quartz layers 33 and 34 are formed simultaneously on the opposite sides of the wafer as shown in FIG. 3. The right-hand portion of layer 33 and the left-hand portion of layer 34 is etched away by hydrofluoric acid which dissolves the quartz but does not attack the silicon, and thus produces the monolithic block with the staggered p-type regions 33′ and 34′, illustrated in FIG. 4. The block is then simultaneously diffused with gallium and phosphorous. Since the concentration of phosphorus is greater than that of gallum and the diffusion coefficient of phosphorus is less than that of gallium the phosphorus will be masked by the portions of the thermally grown oxide layers 33′ and 34′ on the opposite sides of the original wafer, while the galium is not. Accordingly, during the diffusion process with the gallium and phosphorus atmosphere, the gallium will diffuse into the wafer, including the part which is coated with the oxide layer to the depths indicated by the lines 36 and 37, forming p-type layers on the opposite sides of the wafer to the depths indicated by the lines 36 and 37, respectively, as indicated in FIG. 5. Also, because of the difference between the surface concentration of the phosphorus and the gallium and the difference in diffusion coefficient between these two impurities during the double diffusion process, the phosphorus will diffuse into the newly formed p-type regions which are not protected by the oxide blocks 33′ and 34′ and thus an n-type region 38 will be formed on the upper right-hand portion and a second n-type region 39 will be formed on the lower left-hand portion of the wafer as indicated in FIG. 5. The next step is to remove in a hydrofluoric acid etch the quartz masking blocks 33′ and 34′ to give the intermediate product illustrated in FIG. 6. This completes the fabrication of the four-layer diodes 10 and 11.

However, in order to make a convenient monolithic structure the diodes 16 and 17 are fabricated into the structure. To this end, the next step in the process is the soldering of the diodes 16 and 17 to the exposed surfaces of the n-type regions 38 and 39, respectively, shown in FIG. 6. The ohmic contacts joining these diodes to the respective n-type regions 38 and 39 are indicated at 41 and 42, respectively. The next step in the fabrication is to etch isolating lines 50 and 51 across the opposite faces of the wafer between the two completed four-layer diodes 10 and 11, as indicated in FIG. 7, in order to prevent undesired internal conducting paths which otherwise short the device in operation. The final step in the fabrication is to attach ohmic contacts and leads 52 and 53 to the remaining exposed regions of the diodes 16 and 17 to complete the final unit shown in FIG. 8.

From the foregoing it is readily apparent that the present invention provides a novel method for producing a monolithic multilayer semiconductor device and one in which all of the units will have substantially the same characteristics. Although the drawings illustrate fabrication of only two units, it will be readily apparent that the process is adaptable to producing simultaneously any practical number of units from a single wafer.

We claim as our invention:

1. The method of making a monolithic semiconductor device having at least four regions of alternate opposite type semiconductivity which is made by first masking the opposite sides of a wafer of n-type semiconductive material with an oxide layer, removing said oxide layer from selected non-overlapping areas on the respective opposite sides of said wafer, subjecting said wafer to a diffusion step simultaneously with gallium and phosphorus so that p-type regions will be formed on opposite respective sides of said wafer where the masking was not removed and n-type regions will be formed on the respective opposite outer surfaces where the masking was removed said "n" regions being formed over a "p" region, and attaching ohmic contacts to said n-type regions.

2. The method of making a four-layer monolithic semiconductor device comprising the steps of: (a) masking the opposite sides of an n-type silicon wafer, (b) subjecting said wafer to simultaneous diffusion steps with gallium and phosphorus so that gallium diffuses into said silicon wafer to form p-type regions throughout the opposite sides of said wafer including the areas under said masks and the phosphorus displaces the gallium under the unmasked areas to produce n-type regions on top of that portion of the p-type regions, and (c) removing said oxide masks.

References Cited

UNITED STATES PATENTS

| | | | |
|---|---|---|---|
| 2,802,760 | 8/1957 | Derick | 148—189 |
| 2,861,018 | 11/1958 | Fuller | 148—189 |
| 2,981,646 | 4/1961 | Robinson | 148—187 |
| 3,009,841 | 11/1961 | Faust | 148—187 XR |
| 3,092,522 | 6/1963 | Knowles | 148—189 XR |
| 3,144,366 | 11/1964 | Rideout | 148—187 XR |
| 3,178,798 | 4/1965 | Marinace | 148—175 XR |
| 3,203,840 | 8/1965 | Harris | 148—187 |

HYLAND BIZOT, Primary Examiner

U.S. Cl. X.R.

148—335